(12) United States Patent
Wijeratne

(10) Patent No.: US 6,958,629 B2
(45) Date of Patent: Oct. 25, 2005

(54) SINGLE STAGE, LEVEL RESTORE CIRCUIT WITH MIXED SIGNAL INPUTS

(75) Inventor: Sapumal Wijeratne, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 10/769,257

(22) Filed: Jan. 30, 2004

(65) Prior Publication Data

US 2005/0168244 A1 Aug. 4, 2005

(51) Int. Cl.[7] .......................................... H03K 19/00
(52) U.S. Cl. ........................ 326/93; 326/95; 326/98; 327/208; 327/211; 327/212
(58) Field of Search ........................ 326/93, 95, 98, 326/104; 327/51–57, 208–212, 214, 215, 327/224, 225

(56) References Cited

U.S. PATENT DOCUMENTS

| | | | |
|---|---|---|---|
| 5,278,467 A | | 1/1994 | Nedwek |
| 6,057,711 A | * | 5/2000 | Sessions ........................ 326/93 |
| 6,356,117 B1 | * | 3/2002 | Sutherland et al. ........... 326/93 |
| 6,420,907 B1 | * | 7/2002 | Sutherland et al. ......... 326/121 |
| 6,590,428 B2 | * | 7/2003 | Barnes ........................ 327/65 |

* cited by examiner

Primary Examiner—Vibol Tan
(74) Attorney, Agent, or Firm—Schwabe, Williamson & Wyatt, P.C.

(57) ABSTRACT

A circuit comprises a signal trace to receive a first large signal, a first plurality of signal traces to receive a small signal pair and a clock trace to receive a clock signal. The circuit further comprises a mixed signal circuit having at least a first and a second element, coupled to the signal trace, the first plurality of signal traces and the clock trace. The mixed signal circuit it to facilitate generation of a second large signal based at least in part on the small signal pair and the first large signal, with the first large signal and the clock signal driving the first and second elements respectively to transition asynchronously.

27 Claims, 4 Drawing Sheets

SINGLE STAGE, LEVEL RESTORE CIRCUIT WITH MIXED SIGNAL INPUTS

BACKGROUND

1. Field of the Invention

Embodiments of the present invention relate to integrated circuit design, and, more particularly, to input processing of mixed-signal.

2. Description of the Related Art

Presently, integrated circuit technology is such that circuit designs are able to process data at rates which challenge the ability to provide input data to keep the circuit designs at a high operating efficiency. Thus, the frequency of data transfer between circuit designs continues to increase, resulting in increase signal frequencies. This increase in signal frequency applies to both interchip or intrachip communication. For example, an address generation circuit in a processor may be in need of obtaining a cached address from an on-chip cache. With the operating frequency of the address generating circuit rapidly increasing with successive generations of integrated circuit technology, providing timely data from the cache to the address generating circuit may be a challenge. Thus, the communication link between the cache and the address generation unit may attempt to use a high-speed communication link.

Differential signaling, as opposed to single ended signaling, provides advantages that may result in an increased maximum operating frequency. In differential signaling, typically two component signals (sometimes referred to as differential pairs) are used to transmit data instead of one signal, as with single ended signaling. The data value on a differential pair is represented as the difference between the voltage on the two signal components. An example of a common differential signaling protocol is low-voltage differential signaling (LVDS). LVDS uses high-speed analog circuit techniques to provide data transfers on interconnects at hundreds or even thousands of megabits per second. LVDS is a generic interface standard for high-speed data transmission.

Differential signaling provides a number of benefits. Many noise sources are not local to a differential pair. Thus, these noise sources will affect both signals of the differential pair relatively evenly. By affecting both signals of the differential pair relatively evenly, the difference between the two signals will remain relatively constant. Thus, differential signaling provides improved noise immunity compared to a single wire solution. Other advantages are associated with differential signaling as well. When low voltage differential signaling is utilized, the low voltage differential allows for higher switching speeds when compared to large voltage differential signaling and single ended signaling. Thus, differential signaling provides advantages over traditional single ended signaling and is therefore utilized to provide a high-speed communication link between a source and a destination function block.

BRIEF DESCRIPTION OF THE DRAWINGS

Embodiments of the present invention will be described referencing the accompanying drawings in which like references denote similar elements, and in which.

DETAILED DESCRIPTION OF EMBODIMENTS OF THE INVENTION

Figure 1:
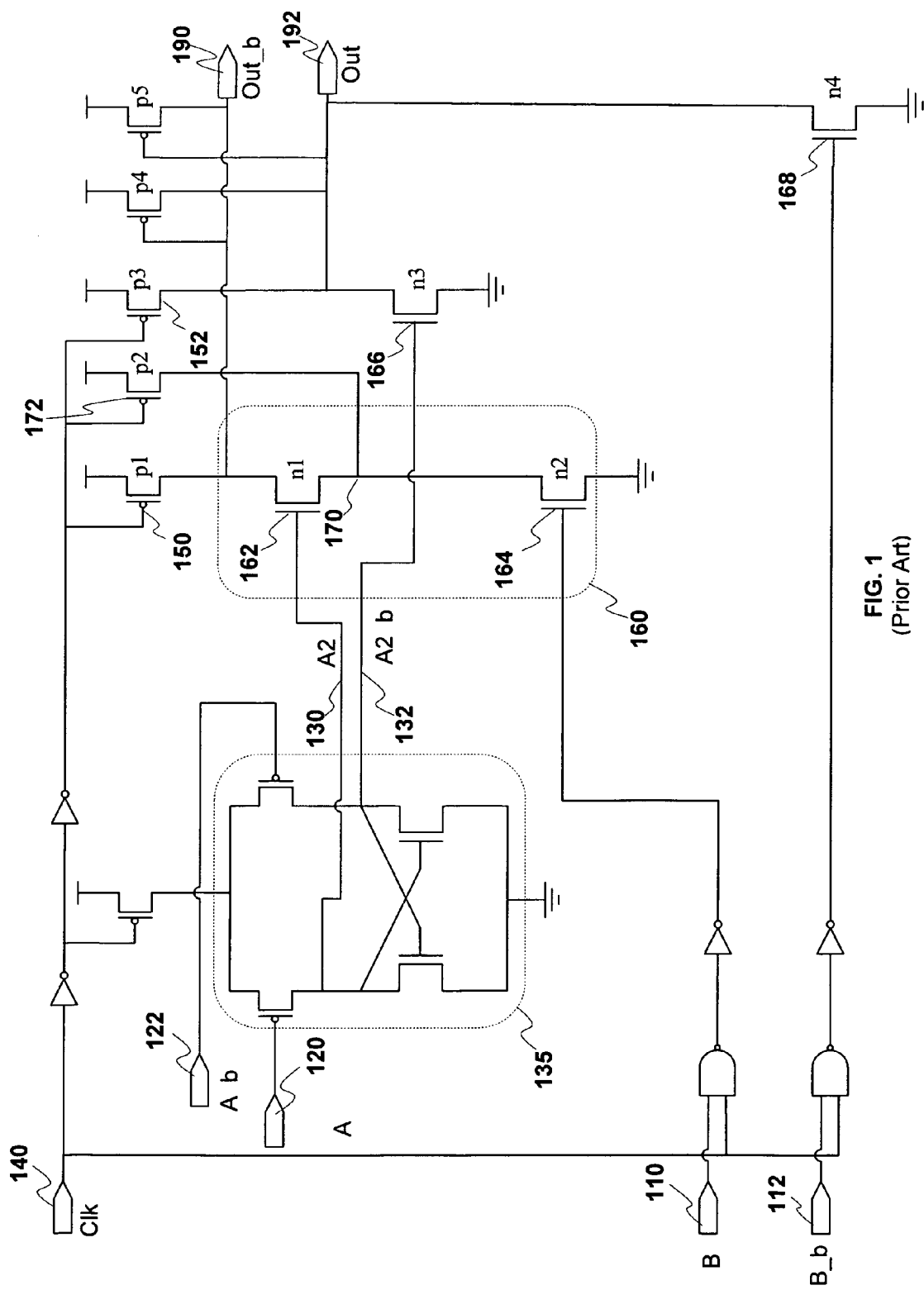
FIG. 1 illustrates a prior art, mixed signal circuit that combines a level restore function with a logical AND function.

In the following description, various aspects of the embodiments of the invention will be described. However, it will be apparent to those skilled in the art that other embodiments may be practiced with only some or all of these aspects. For purposes of explanation, specific numbers, materials and configurations are set forth in order to provide a thorough understanding of these embodiments. However, it will also be apparent to one skilled in the art that other embodiments may be practiced without the specific details. In other instances, well-known features are omitted or simplified in order not to obscure the description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. A signal is an electrical signal that is carried on the metal lines, traces, wires, conductors, signal paths and signaling mediums.

As previously discussed, low voltage signaling uses low voltage signals to transfer data. This transfer may be via signals between devices in a multi-chip module or devices on a circuit board. Alternatively, the transfer of data via signals may be between blocks of a circuit design on a single integrated circuit. That is, an integrated circuit may be arranged into multiple circuit portions, e.g. blocks. Low voltage signaling may be utilized to facilitate communication of signal values between these blocks.

Designs utilizing low voltage signaling to transmit signals may do so to provide for an increase in the operating frequency of a circuit. Certain of the signals represented by low voltage signals, may be on a "critical path" of the circuit. That is, the low voltage signals may be on a signal path of the circuit that is defining the upper limits on the operating frequency of that circuit. Thus, it may be desirable to try to improve the operating frequency of a signal path involving these low voltage signals.

Low voltage signals are generated and supplied on signal traces by a transmitting block. The low voltage signals may be of the order of tens or hundreds of millivolts. The low voltage signals are received by a receiving block. The receiving block provides these low voltage signals to a sense amplifier. The sense amplifier may perform amplification and level shifting. In such a case, the resultant signals are still typically "small signals" however, they may be level shifted and have a larger voltage, perhaps in the hundreds of millivolt range. Small signals still differ from large signals in that the latter are typically signals that are operating at higher voltage levels for a digital process technology in use. For example, large signals may be operating at 0 volts and 1.5 volts to represent two logic levels for a particular process technology.

As mentioned, upon receipt of low voltage signals by a portion of a circuit, low voltage signals may be sense amplifier to small signal values. After sense amplification, the resultant small signals may be level restored to large signals, e.g. digital logic level signals. The resultant large signals may be utilized in logic operations with other large signals in the circuit block. For example, a signal may be amplified to a small signal, SS1, and then level restored to a large signal, LS1. LS1 may then be logically ANDed with another large signal, LS2, in the design. This multi stage approach to level restoring and performing a logic operation between two signals may be inefficient for signals on a critical path of a design. One method that may be utilized to improve a circuit containing such a structure is to combine the "level restore" and "logic" functions to provide a level restore circuit for mixed signals (e.g. small signals and large signals).

FIG. 1 illustrates a prior art, mixed signal circuit that combines a level restore function with a logical AND function. Sense amplifier circuit 135 (sense amp reset and equalization circuitry omitted for clarify) provides a conversion from low voltages signals on inputs A 120 and A_b 122 signals to small signals on the outputs, A2 130 and A2_b 132, of the sense amplifier 135 ("_b" suffix utilized to denote differential or complementary signal names). Inputs B 110 and B_b 112 are large signal inputs. Inputs B 110 and B_b 112 are ANDed with, and thus synchronized with, clock signal, Clk 140 respectively.

During a precharge phase of the clock 140 in this circuit, several signal values are precharged, or preset. Output signals, Out 190 and Out_b 192, are precharged high via precharge devices p1 150 and p3 152. Sense amplified small signals A2 130 and A2_b 132 are precharged low by sense amplifier 135 (precharge logic not illustrated). Gate signals to N-MOSFET devices n2 164 and n4 168 are precharged low.

N-MOSFET devices 162–168 provide level restore and logic AND function between small signal inputs A2 130 and A2_b 132 and large signal inputs B 110 and B_b 112. Pull-down network 162–164 comprises an AND stack as part of a logic function for small signal input A2 130 and large signal input B 110. Output node 190 driven by AND stack is precharged high. In this prior art device, internal node 170 of the AND stack is precharged through device p2 172 driven by clock, clk 140. Internal node 170 is precharged high to avoid charge sharing complications between output 190 and internal node 170. Note that there is no evaluation device for the AND stack. Thus, as a result of the precharging of internal node 170, and the lack of evaluation device, to avoid direct current (DC) conduction between the power supply and ground, the input to n2 160 must remain off during precharge. To ensure that n2 160 is off during precharge, B 110 is ANDed with clock, Clk 140.

Figure 2:
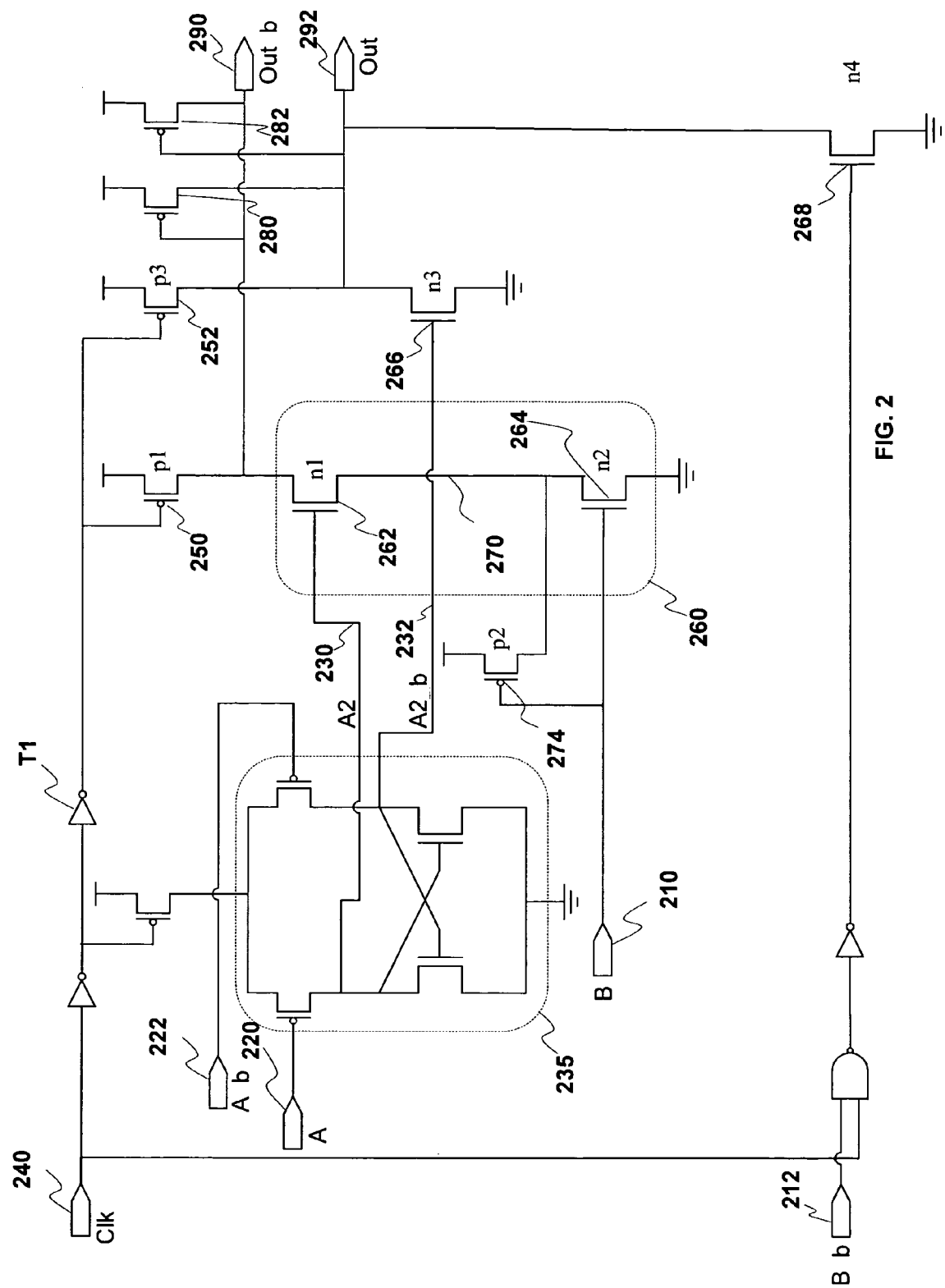
FIG. 2 illustrates an improved design with mixed signal inputs for a level-restore circuit with a logical AND function, in accordance with one embodiment.

FIG. 2 illustrates an improved design with mixed signal inputs for a level-restore circuit with a logical AND function, in accordance with one embodiment. Sense amplifier 235 receives low voltage signals A 220 and A_b 222 and provides amplified signals A2 230 and A2_b 232. In addition to providing amplification, the sense amplifier 235 precharges amplified signals A2 230 and A2_b 232 to a low voltage during a precharge period of clock, Clk 240. In one embodiment, sense amplifier 235 may be a ratioed P sense amplifier. Sense amplifier 235 is represented by various devices known in the art and will not be further described.

The improved design of FIG. 2 advantageously allows the input B 210 to drive the input to device n2 264 asynchronously from the clock 240. Recall that in the prior art implementation of FIG. 1, the transition the signal on the input to device n2 164 occurs substantially concurrently with the transition of clock, Clk 140. This was performed intentionally to avoid a DC conduction between the power supply and ground. In addition to the transition on the input of device n2 264 being substantially concurrent with the clock 240, the transition of the input to n1 162 is, by the nature of the operation of the sense amplifier, synchronous with Clk 140. Thus, in the case where n2 160 is made synchronous with Clk 140, a result is concurrent switching of the transistors n2 164 and n1 162 in the AND stack.

The improved device illustrated in FIG. 2 advantageously allows one of the transistors 264 in the AND stack 260 to transition asynchronously to the clock, Clk 240. Indeed, in one embodiment, the large signal B 210 driving transistor n2 264 is designed to transition asynchronously to the clock, 240. This results in the elimination of the concurrent switching of the transistors in the AND stack 260. Such concurrent switching of transistors in the AND stack 260 may produce a number of undesired effects. One effect is a slower falling transition on the AND stack's output. In a case where there is to be a high to low transition on output 290, large signal B 210 and small signal A2 230 will both be at a "high" voltage for their respective technologies. In the case where both devices n1 262 and n2 264 transition concurrently, the drain to source voltage, $V_{DS}$, across n1 262 does not build until the voltage at the internal node 270 is pulled down. That is, n1 262 will not begin to transition until n2 264 has pulled down internal node 270. This delay in the transition of n1 262 results in a delay on the high to low transition of output 290. However, if n2 264 is allowed to transition asynchronously to n1 262, internal node 270 will be already driven to a low voltage by the asynchronous large signal B 210 when small signal A2 230 transitions. When small signal A2 230 transitions, a proper voltage is already present across the drain and source of n1 262. This allows for a quicker transition on output 290 when compared to the case where both n1 262 and n2 264 transition concurrently. Thus, by allowing n1 264, associated with the large signal B 210, to transition asynchronously to the clock 240, and thus asynchronously to the small signal A2 230, concurrent switching of the AND stack 260 may be eliminated. By eliminating the concurrent switching of the transistors of the AND stack 260, a faster high to low transition can occur on the output 290 driven by the AND stack 260.

Cross-coupled PMOS devices 280–282 may provide differential amplification functions to aid in the level restore function. Because of the precharge of outputs 290–292 to a high voltage, P-MOSFET devices 280–282 are initially inactive during evaluation of the circuit thus having no effect on outputs 290–292. However, as a first output, e.g. 290, begins to be driven to a low voltage, a low voltage on output 290 activates corresponding P-MOSFET device 280. As a result of the activation of P-MOSFET device 280, second output 292 will be driven to a high voltage. Thus, any noise that may occur on the second output 292, e.g. as a result of noise on the output A2_b 232 of sense amplifier 235, will not be successful in driving the second output 292 to a low voltage. The result is robust, complementary outputs at digital logic levels on outputs 290–292.

Due to the possibility of charge sharing between output 290 of the AND stack 260 and internal node 280, precharge device p2 274 is utilized in the circuit. The precharge device p2 274 for the internal node 270 is a data driven precharge device. Thus, when large signal input 210 is low, precharge device p2 274 ensures that internal node 270 is precharged to avoid possible issues associated with charge sharing between output 290 and internal node 270.

However, when appropriate for the large signal input 210, the improved design advantageously enables a pre-discharge of the internal node 270 prior to the sense amplifier output switching. For example, assume that, asynchronous to small signal A2 230 switching from it's precharged low value to a high value, input B 210 transitions from low voltage to high voltage. In the embodiment illustrated, internal node 270 will discharge from high voltage to low voltage. This discharge of internal node 270 occurs asynchronous to a transition from the precharged low value on small signal A2 230 to a high value. Thus, when small signal A2 230 transitions to a high value, enabling n1 262, internal node 270 will already be at a low voltage level. In the case where both transitions occur substantially concurrently, e.g. concurrent transitions in the prior art device of both inputs to AND stack devices n1 162 and n2 164, the miller effect between the gate to drain may cause gate to drain capacitance to effectively double. This effective doubling of the gate to drain capacitance may result in an increased delay in the rise of the precharged low output 130 on the sense amplifier 135. This, in turn may cause a delay in the transition on out_b 190. In the embodiments illustrated in FIG. 2, by allowing internal node 270 to transition prior to the transition on small signal A2 230, miller effects associated with concurrent transitions on the AND stack may be reduced.

In addition to providing speed advantages, the embodiments of the improved design may also provide other advantages. For example, the improved design may reduce the total dynamic power consumption. As mentioned, the internal precharge device 274 is data driven instead of clock driven. Thus, by not having to drive the addition precharge device, the loading on the clock is reduced. In addition, as discussed above, in the improved design, a large signal 210 may arrive at device AND stack device 264 asynchronously to clock 240. Thus, it is not necessary to AND the large signal 210 with clock 240; thus, also reduces the loading on the clock signal 240.

Another advantage offered by the embodiments of the improved device illustrated herein is that the activity factor of the internal node 274 may be reduced. When precharged by a clock signal, the internal node is precharged every clock. In comparison, when the precharge of the internal node occurs by a large signal, depending on the activity of the large signal 210, a reduction of the transitioning of the internal node 274 may occur.

In addition to the improved performance previously described, as illustrated, the improved design may result in an area reduction. When compared to the prior art design of FIG. 1, it can be seen that one NAND gate/inverter pair have been eliminated. Such elimination reduces the gate count in the improved design. Thus, the improved design advantageously reduces the area required for the implementation of a level-restore circuit with mixed signal inputs.

Figure 3:
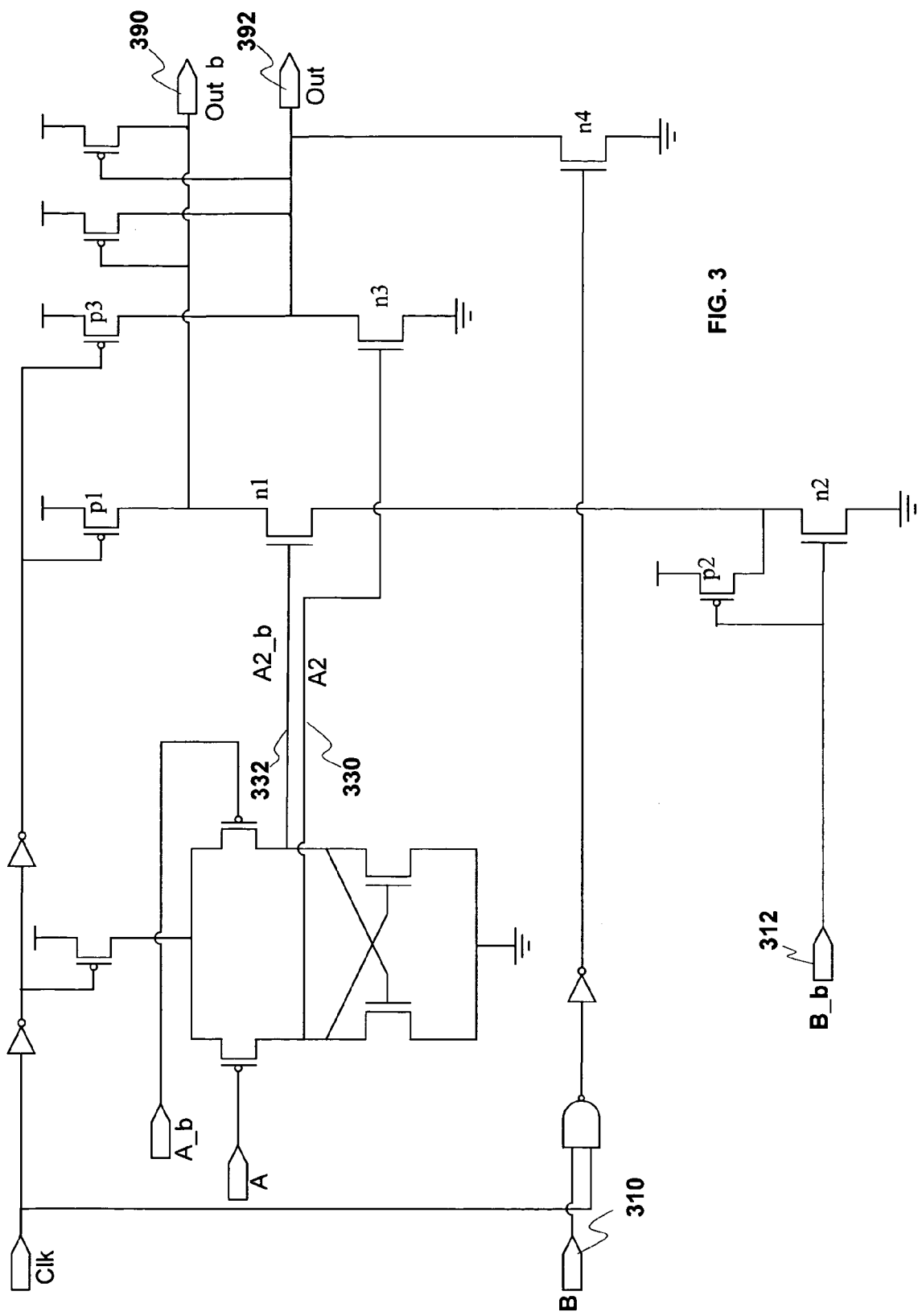
FIG. 3 illustrates an improved design with mixed signal inputs for a level-restore circuit with a logical OR function between a small signal pair and a large signal.

FIG. 3 illustrates an improved design with mixed signal inputs for a level-restore circuit including a logical OR function between a small signal pair and a large signal. In embodiment illustrated, the AND stack utilizes the complementary small signal 332 and large signal 312 to generate the large signal output 390. That is, in the previous embodiment, an AND stack was utilized to generate a NAND output. In current embodiment, utilizing complementary inputs for the small signal 332 and large signal 312, the AND stack is utilized to generate the logical output of the negation of the NOR function, generating the logical output of an OR function:

$$A + B = \overline{\overline{A} \cdot \overline{B}}$$

Thus, the AND stack operates with A2_b 322 and B_b 312 instead of A2 320 and B 310 as the inputs for determining the OR function. The improved device is utilized to provide a solution for mixed signals utilizing the logical OR function between small signal pair A2 320 and A2_b 322 and large signals B 310 and B_b 312. The pull-down network may be of sufficient complexity to represent any arbitrary logic function, e.g. exclusive NOR, multiplexor, represented by small signal and large signal inputs. Thus, it will be appreciated by those skilled in the art that that the improved design of the AND stack disclosed herein can be utilized in the pull-down network of other logic functions of small signal and large signal inputs.

Thus, the improved device disclosed herein provides a single stage, mixed signal circuit including logic function. The device provides a full-rail, digital level signal output based on a logic function of a large signal and a small signal input. The embodiments illustrated herein contains a single small signal input and a single large signal input. However, it will be appreciated by those skilled in the are that, using the teachings of the above description, embodiments employing three or more inputs may be constructed.

Figure 4:
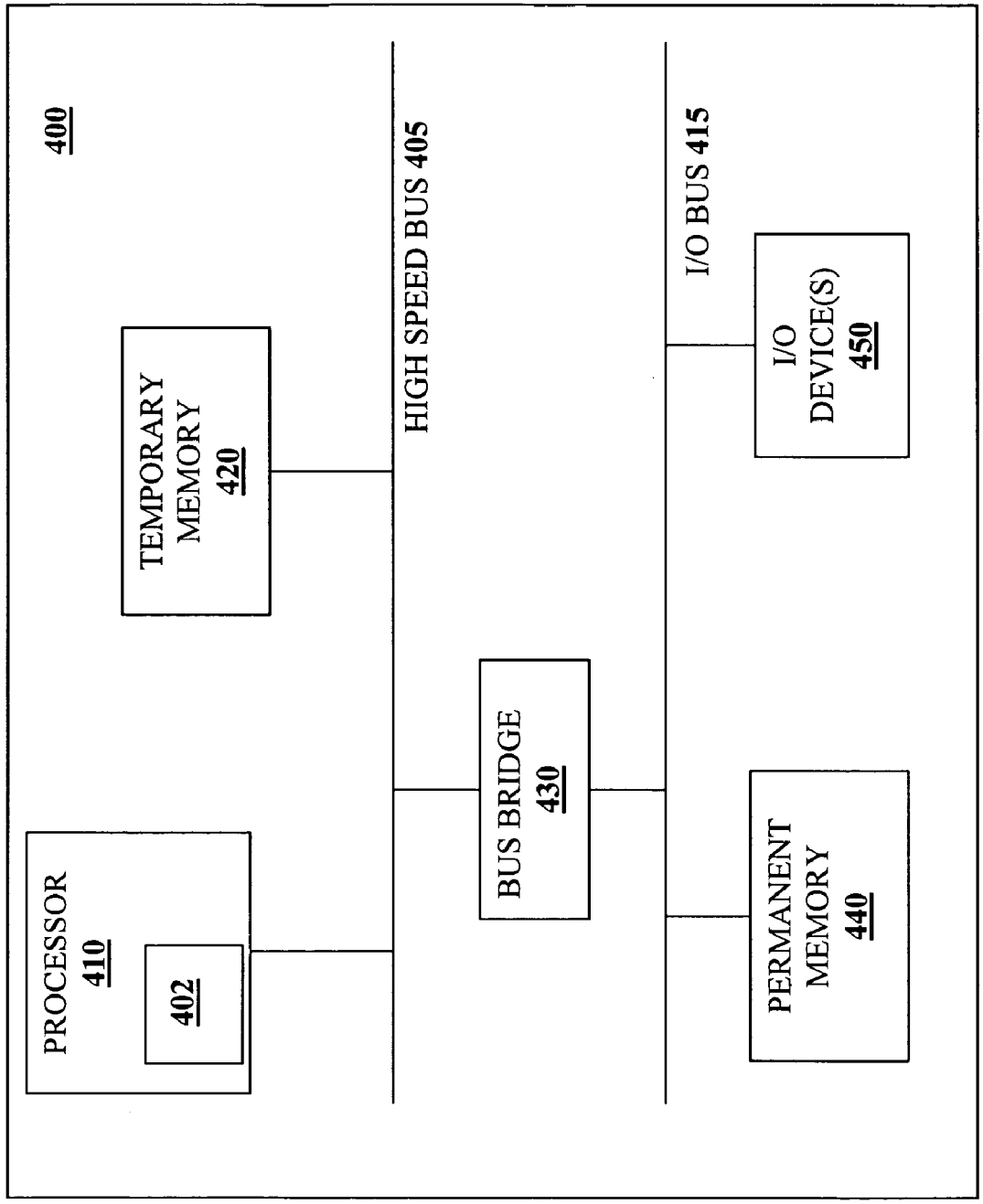
FIG. 4 illustrates is a block diagram of a computer system including a level restore circuit with mixed signal inputs, in accordance with one embodiment.

FIG. 4 illustrates is a block diagram of a computer system 400 including one or more level restore circuits with mixed signal inputs 402, in accordance with one embodiment. As shown, the computer system 400 includes a processor 410 and temporary memory 420, such as SDRAM and DRAM, on high-speed bus 405. Level restore circuit(s) 402, incorporated with the earlier described improved design, advantageously provides level restore and logic functionality for blocks with mixed signal inputs in processor 410. High-speed bus is connected through bus bridge 430 to input/output (I/O) bus 415. I/O bus 415 connects permanent memory 440, such as flash devices and fixed disk device, and I/O devices 450, such as a networking interface, to each other and bus bridge 430.

Thus, a unique design of a level restore circuit is provided. While the invention has been described in accordance with a number of embodiments, the invention should not be considered so limited. One skilled in the art will recognize that various other embodiments can be utilized to provide the advantages described herein.

What is claimed is:

1. A circuit comprising:
    a signal trace to receive a first large signal;
    a first plurality of signal traces to receive a small signal pair;
    a clock trace to receive a clock signal; and
    a mixed signal circuit having at least a first and a second element, coupled to the signal trace, the first plurality of signal traces and the clock trace, to facilitate generation of a second large signal based at least in part on the small signal pair and the first large signal, with the first large signal and the clock signal driving the first and second elements respectively to transition asynchronously.

2. The circuit of claim 1 wherein the mixed signal circuit comprises a pull-down network.

3. The circuit of claim 2 wherein the pull-down network comprises an AND stack.

4. The circuit of claim 3 wherein an internal node of the AND stack is precharged and pre-discharged by the first large signal.

5. The circuit of claim 1 wherein the mixed signal circuit comprises precharge circuitry coupled to the second large signal trace, a third large signal trace and the clock trace to precharge the second large signal trace and the third large signal trace to a first voltage level.

6. The circuit of claim 5 further comprising sample circuitry coupled to the second and the third large signal traces to facilitate detection of a transition on one of the second and the third signal traces from the first voltage level to a second voltage level, sample circuitry to reinforce the second voltage level on the signal trace detected in transition and to assert the first voltage level on the signal trace not detected in transition.

7. The circuit of claim 6 wherein said sample circuitry comprises cross coupled P-MOSFET devices.

8. The circuit of claim 1 further comprising
a second plurality of signal traces to receive a small signal differential pair; and
a sense amplifier coupled to the second plurality of signal traces to receive a small signal differential pair and coupled to the first plurality of signal traces to provide the small signal pair.

9. The circuit of claim 7 wherein the sense amplifier precharges the small signal pair to a low value during an inactive phase of the clock signal.

10. The circuit of claim 7 wherein the sense amplifier comprises a ratioed P sense amplifier.

11. A circuit comprising:
a first signal trace to receive a first large signal;
a first plurality of small signal traces to receive a small signal pair;
a mixed signal circuit coupled to the signal trace and one of the first plurality of small signal traces to facilitate generation of a second large signal on a second signal trace wherein the second large comprises a logic value of a logic function of one small signal of the small signal pair corresponding to the one of the first plurality of signal traces and the first large signal, wherein the first large signal transitions asynchronously to a clock signal.

12. The circuit of claim 11 wherein the mixed signal circuit comprises an AND stack.

13. The circuit of claim 12 wherein an internal node of the AND stack is precharged by the first large signal.

14. The circuit of claim 11 wherein the mixed signal circuit comprises precharge circuitry coupled to the second large signal trace, a third large signal trace and the clock trace to precharge the second large signal trace and the third large signal trace to a first voltage level.

15. The circuit of claim 14 further comprising sample circuitry coupled to the second and the third large signal traces to facilitate detection of a transition on one of the second and the third signal traces from the first voltage level to a second voltage level, sample circuitry to reinforce the second voltage level on the signal trace detected in transition and to assert the first voltage level on the signal trace not detected in transition.

16. The circuit of claim 15 wherein said sample circuitry comprises cross coupled P-MOSFET devices.

17. The circuit of claim 11 further comprising:
a second plurality of signal traces to receive a small signal differential pair; and
a sense amplifier coupled to the second plurality of signal traces to receive a small signal differential pair and coupled to the first plurality of signal traces to provide the small signal pair.

18. The circuit of claim 17 wherein the sense amplifier precharges the small signal pair to a low value during an inactive phase of the clock signal.

19. The circuit of claim 11 wherein the logic function comprises one of an NAND, NOR, multiplexor and exclusive-NOR.

20. A system comprising:
a processor including;
a circuit comprising:
a signal trace to receive a first large signal;
a first plurality of signal traces to receive a small signal pair;
a clock trace to receive a clock signal; and
a mixed signal circuit having at least a first and a second element, coupled to the signal trace, the first plurality of signal traces and the clock trace, to facilitate generation of a second large signal based at least in part on the small signal pair and the first large signal, with the first large signal and the clock signal driving the first and second elements respectively to transition asynchronously;
a networking interface;
a memory configured to store data; and
a bus coupled to the processor, networking interface and memory.

21. The system of claim 20 wherein the mixed signal circuit comprises a pull-down network implementing a logic function between the first large signal and the logic value associated with the small signal pair.

22. The system of claim 21 wherein the pull-down network comprises an AND stack.

23. The system of claim 22 wherein an internal node of the AND stack is precharged/pre-discharged by the first large signal.

24. The system of claim 20 wherein the mixed signal circuit comprises precharge circuitry coupled to the second large signal trace, a third large signal trace and the clock trace to precharge the second large signal trace and the third large signal trace to a first voltage level.

25. The system of claim 24 further comprising sample circuitry coupled to the second and the third large signal traces to facilitate detection of a transition on one of the second and the third signal traces from the first voltage level to a second voltage level, sample circuitry to reinforce the second voltage level on the signal trace detected in transition and to assert the first voltage level on the signal trace not detected in transition.

26. The system of claim 20 wherein the circuit further comprises:
a second plurality of signal traces to receive a small signal differential pair; and
a sense amplifier coupled to the second plurality of signal traces to receive a small signal differential pair and coupled to the first plurality of signal traces to provide a small signal pair.

27. The system of claim 26 wherein the sense amplifier comprises a ratioed P sense amplifier.

* * * * *

UNITED STATES PATENT AND TRADEMARK OFFICE
CERTIFICATE OF CORRECTION

PATENT NO. : 6,958,629 B2  Page 1 of 1
APPLICATION NO. : 10/769257
DATED : October 25, 2005
INVENTOR(S) : Sapumal Wijeratne It is certified that error appears in the above-identified patent and that said Letters Patent is hereby corrected as shown below:

On The Drawings
Figure 2
Reference numbers 212, 250, 252, 266, and 268 should be deleted.

Figure 3
Reference numbers 330 and 392 should be deleted.

Column 3
Lines 49-50, "...n2 160..." should read --...n2 164...--.

Column 4
Line 7, "...n2 160..." should read --...n2 164...--.
Line 11, "...transisters 264..." should read --...transisters 262-264...--.
Line 37, "...n1 264..." should read --...n2 264...--.

Column 5
Lines 41 and 46, "...internal node 274..." should read --...internal node 270...--.

Column 6
Lines 6 and 10, "...A2_b 322..." should read --...A2_b 332...--.
Lines 7 and 10, "...A2 320..." should read --...A2 330...--.

Column 7
Line 38, "...second large comprises..." should read --...second large signal comprises...--.

Signed and Sealed this

Twenty-ninth Day of May, 2007

JON W. DUDAS
*Director of the United States Patent and Trademark Office*